US006965131B2

(12) United States Patent
Chang

(10) Patent No.: US 6,965,131 B2
(45) Date of Patent: Nov. 15, 2005

(54) THYRISTOR SWITCH WITH TURN-OFF CURRENT SHUNT, AND OPERATING METHOD

(75) Inventor: Hsueh-Rong Chang, Thousand Oaks, CA (US)

(73) Assignee: Rockwell Scientific Licensing, LLC, Thousand Oaks, CA (US)

( * ) Notice: Subject to any disclaimer, the term of this patent is extended or adjusted under 35 U.S.C. 154(b) by 30 days.

(21) Appl. No.: 10/383,598

(22) Filed: Mar. 7, 2003

(65) Prior Publication Data

US 2004/0173814 A1 Sep. 9, 2004

(51) Int. Cl.[7] .................................................. H01L 29/74
(52) U.S. Cl. ......................... 257/138; 257/133; 257/137
(58) Field of Search ................................ 257/133, 137, 257/138, 147, 153

(56) References Cited

U.S. PATENT DOCUMENTS 4,963,950 A 10/1990 Chang et al. ............... 257/138
5,324,967 A * 6/1994 Honma et al. ............. 257/147
5,329,142 A 7/1994 Kitagawa et al. ........... 257/139
5,471,075 A * 11/1995 Shekar et al. ............... 257/139
5,977,570 A 11/1999 Takahashi et al. .......... 257/136
6,392,273 B1 5/2002 Chang ........................ 257/330
6,399,998 B1 6/2002 Chang ........................ 257/565

OTHER PUBLICATIONS

Kaushik Rajashekara, *Power Semiconductor Devices, The Electrical Engineering Handbook*, Richard C. Dorf, CRE Press, pp. 763–769, 1997.

* cited by examiner

*Primary Examiner*—Christian Wilson
(74) *Attorney, Agent, or Firm*—Koppel, Jacobs, Patrick & Heybl

(57) ABSTRACT

A semiconductor switch includes a thyristor and a current shunt, preferably a transistor in parallel with and controlled by the thyristor, which shunts thyristor current at turn-off. The thyristor includes a portion of a drift layer, with a p-n junction formed below a gate adjacent to the drift layer to establish a depletion region with a high potential barrier to thyristor current flow at turn-off. The drift layer also provides the transistor base, as well as a current path allowing the transistor base current to be controlled by the thyristor. The switch is voltage controlled using an insulated gate.

12 Claims, 3 Drawing Sheets

FIG. 1
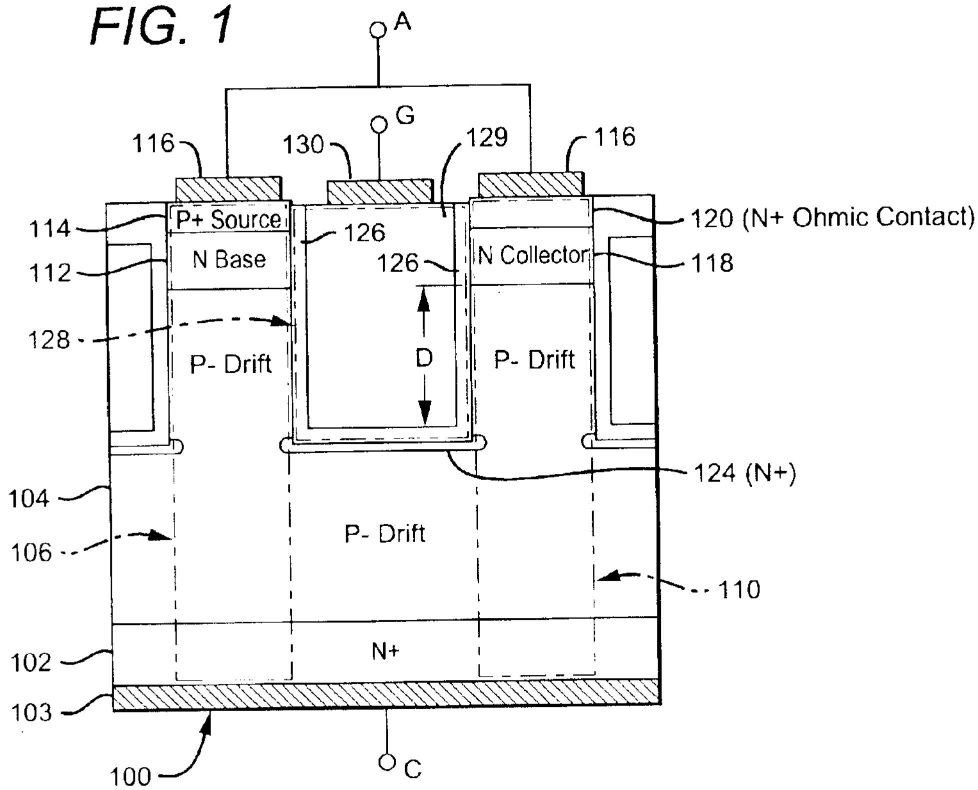
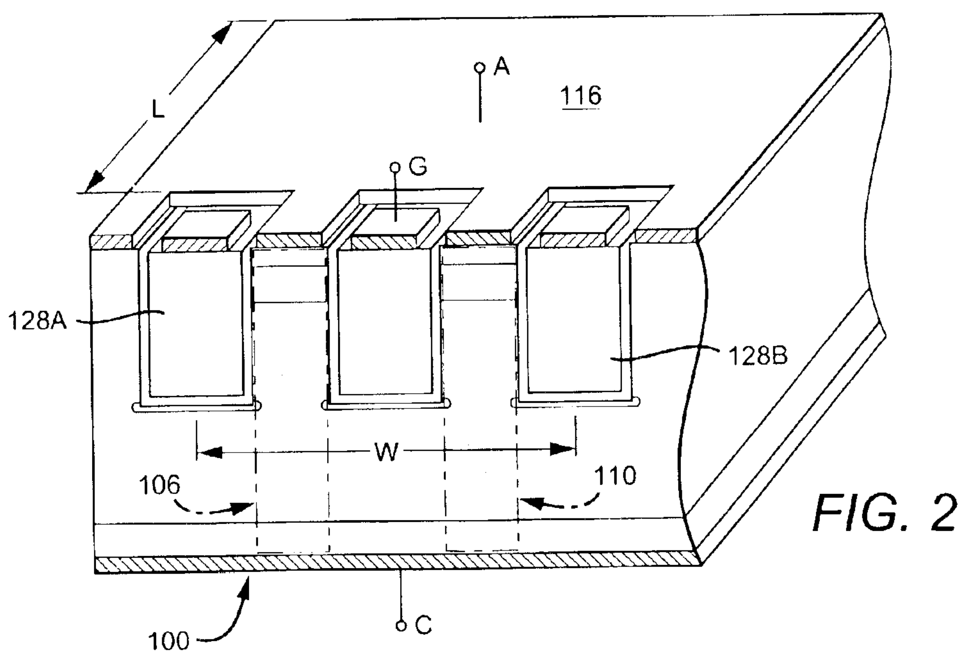
FIG. 2

FIG. 3
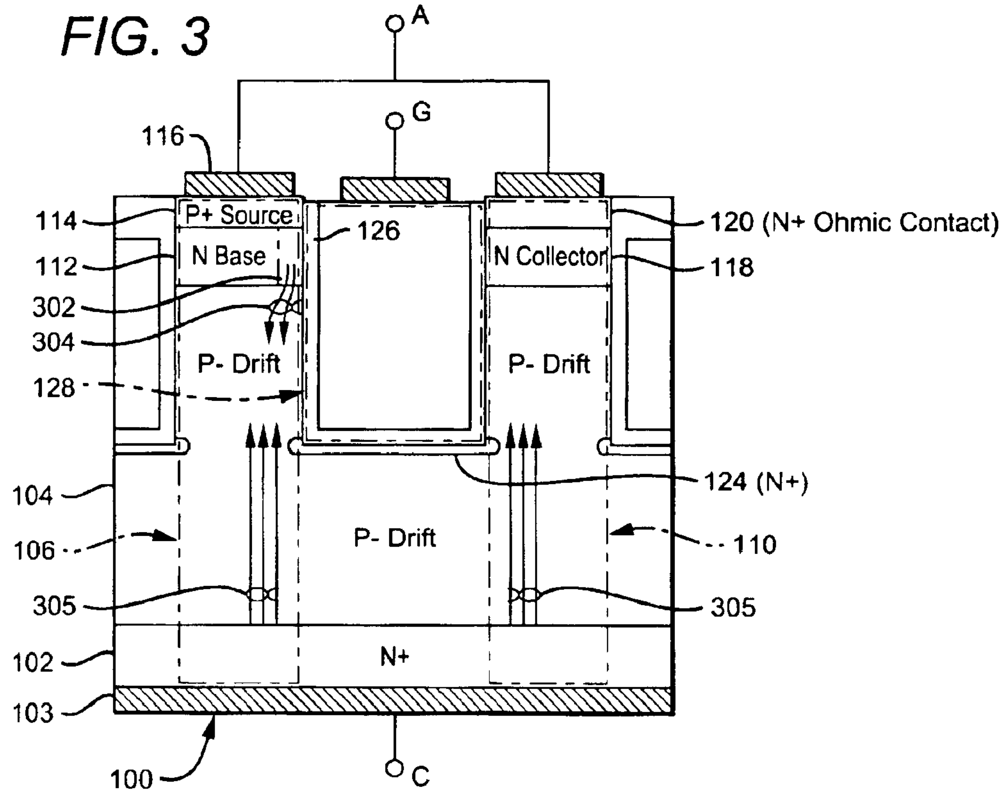
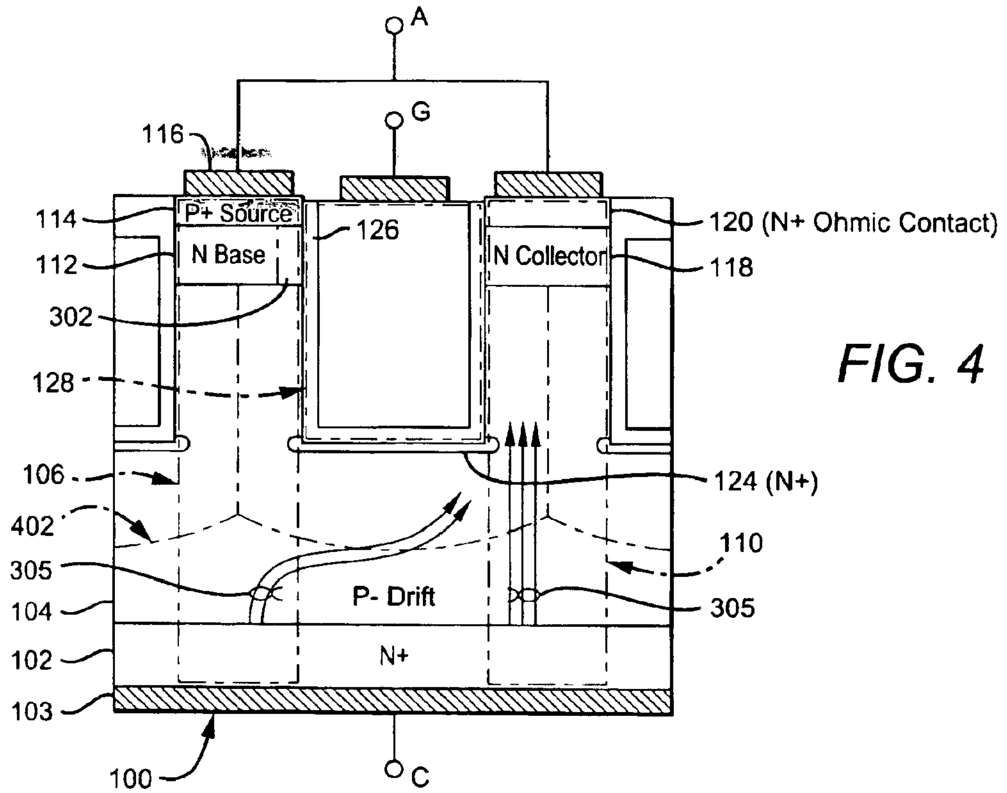
FIG. 4

THYRISTOR SWITCH WITH TURN-OFF CURRENT SHUNT, AND OPERATING METHOD

BACKGROUND OF THE INVENTION

1. Field of the Invention

This invention relates to semiconductor switches, and particularly to high-power switches.

2. Description of the Related Art

Semiconductor switches are increasingly required to control large amounts of power while conforming to demanding power loss requirements. Such switches are typically used in motor control systems, uninterrupted power supplies, high-voltage DC transmission, induction heating, and many other high power applications.

Typical high power switches include gate turn-off thyristors (GTO), insulated-gate bipolar transistors (IGBTs) and accumulation field effect transistors (FETs). (See *The Electrical Engineering Handbook*, Richard C. Dorf, CRC Press, 1997, pp 763–769). GTOs are current control devices that suffer from high power dissipation in the gate drive during turn-off because the reverse gate current amplitude is dependent on the anode current to be turned-off. For example, a 2000 A peak current GTO may require as high as 500 A of reverse gate current. In high frequency megawatt systems, such high reverse gate current losses are undesirable. Also, the forward voltage drop across silicon based GTOs utilized in a 6.5 Kv system may approach 5 volts. An IGBT device in a similar system may experience a forward voltage drops approaching 7 or 8 volts. Accumulation FETs suffer from complex fabrication processes, thus limiting their use to lab scale demonstration rather than commercial scale applications.

A need continues to exist for a high power switch with a lower forward voltage drop and lower power dissipation that does not require complex fabrication processes.

SUMMARY OF THE INVENTION

A semiconductor switch is disclosed for use in high power circuits. It has a thyristor with a current shunt that shunts current away from the thyristor during turn-off to enable a rapid termination of thyristor regenerative action.

In one embodiment of the invention, the current shunt is implemented with a transistor that is connected in parallel with the thyristor and is turned on and off in response to the thyristor turning on and off, respectively, with the transistor lagging the thyristor in turning off and absorbing thyristor current to enable a very rapid thyristor turn-off. The thyristor includes a portion of a drift layer with a light first polarity doping, and an insulated gate that terminates adjacent to the drift layer. The transistor includes a second portion of the drift layer as its base. The region below the gate is heavily doped to form a p-n junction with the drift layer that establishes a high potential barrier to thyristor current flow during turn-off, allowing high current levels to be controlled.

BRIEF DESCRIPTION OF THE DRAWINGS

The components in the figures are not necessarily to scale, emphasis instead being placed upon illustrating the principals of the invention. Like reference numerals designate corresponding parts throughout the different views.

FIG. 1 is a cross-sectional view of a switch in accordance with one embodiment of the invention;

FIG. 2 is a perspective view of the switch of FIG. 1;

FIG. 3 is a cross-sectional view of the switch of FIG. 1 illustrating its operation during turn-on;

FIG. 4 is a cross-sectional view of the switch of FIG. 1, illustrating its operation during turn off;

DETAILED DESCRIPTION OF THE INVENTION

Figure 5:
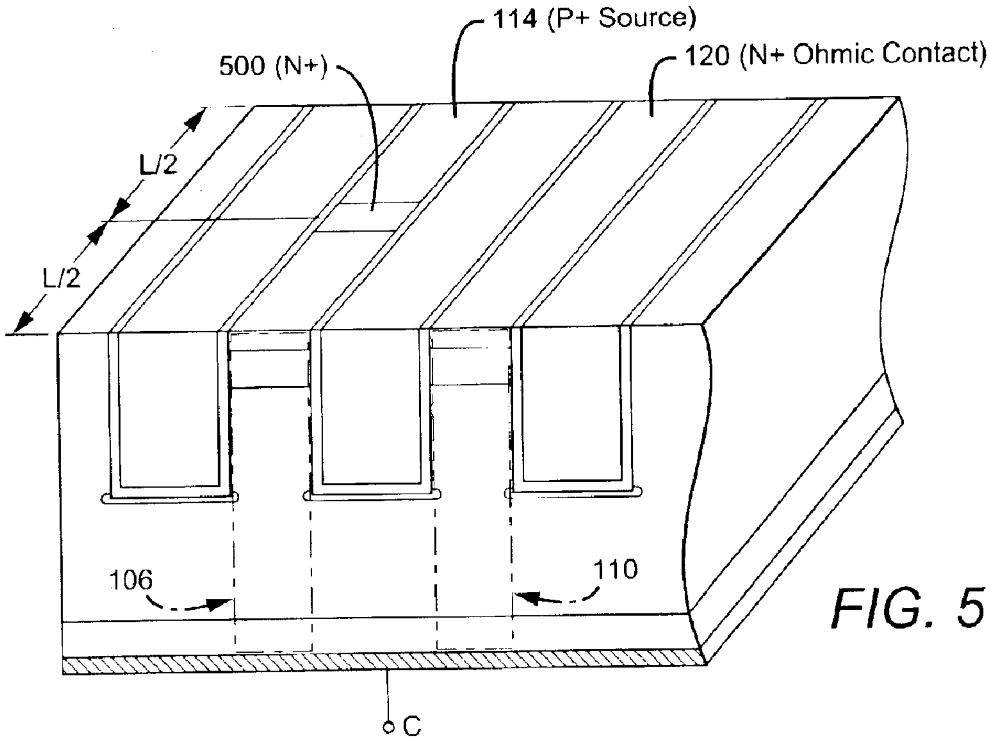
FIG. 5 is a perspective view of a second embodiment of the switch of FIG. 1.

A semiconductor switch, in accordance with one embodiment of the invention, includes a thyristor with a current shunt that shunts current away from the thyristor during turn-off to enable a rapid termination of regenerative thyristor action. The switch achieves a low-forward-voltage drop in the on state. A high turn off current capability is achieved in the reverse-blocking mode using a MOS gate for voltage control. A plurality of such switches are disposed side-to-side with common anode, cathode and gate connections to obtain a desired current rating.

In one implementation of the invention shown in FIG. 1, a foundation for the switch 100 is formed from a P– drift layer 104 on an N+ substrate region 102. The N+ substrate region may be formed by ion implantation or diffusion. A cathode metal 103 contacts the substrate 102 to serve as the switch's cathode C. A thyristor 106 is defined by a portion of this PN junction base. An N base layer 112 sits on the drift layer, with a P+ source layer 114 on the base layer 112. The thyristor 106 is thus described by a portion of the drift layer 104 and the substrate 102, the base layer 112 and the source layer 114 to form a thyristor with a PNPN doping structure. An anode A is connected to the source layer 114 via an anode metal 116.

A transistor 110 is defined by a second portion of the PN junction base (102, 104). It also has two more layers including an N collector layer 118 on the drift layer 104 and an N+ ohmic contact layer 120 on the collector layer 118. The transistor provides current shunting from the thyristor at switch turn-off. The anode A connects to the collector layer 118 via the anode metal 116 on the ohmic contact layer 120.

The switch 100 includes a gate 128 that extends into the drift layer 104 to a depth D and separates the thyristor's base layer 112 and source layer 114 from the transistor's collector layer 118 and ohmic contact layer 120. It includes a conductive material 129 with an upper surface generally planar with the upper surfaces of source layer 114 and ohmic contact layer 120. It is insulated from the thyristor, transistor and underlying portion of the drift layer 104 by an insulating layer 126 which extends across its bottom and up its sidewalls. The gate 128 completes a field-effect transistor (FET) when viewed in combination with the source, base, and drift layers (114, 112, and 104) of the thyristor 106. Gate terminal G is connected to the gate 128 via a metal contact 130 on the conductive material 129.

A shallow N+ region ("switch-turn-off region") 124 is formed directly under the insulating layer 126 at the bottom of the gate 128 to produce a thick depletion region (see FIG. 4) when a positive voltage is applied to the gate contact G for device turn-off.

The anode metal contact 116 is preferably Nickel or Nickel layered with Aluminum. The insulating layer 126 may be formed from either a polyoxide, CVD oxide or a low temperature oxide. A metal or heavily doped polysilicon may also be used for the conductive material 129.

In one switch designed to provide a blocking voltage of 6.5 Kv between the Anode A and Cathode C, the insulating layer 126 is 0.05–0.2 microns thick and the various other elements of the switch have the approximate thicknesses, widths and carrier concentrations listed in Table 1.

TABLE 1

| | Thickness (microns) | Width (microns) | Carrier Concentration, Nd ($cm^{-3}$) |
|---|---|---|---|
| Cathode metal 103 | 0.3–0.5 | NA | NA |
| N+ substrate 102 | 0.5–400 | NA | $N_d > 5E17$ |
| P− Drift layer 104 | 40–60 | NA | $2E14 < N_a < 8E14$ |
| Gate 128 | 4 | 2 | NA |
| Gate recess D | 2 | NA | NA |
| N base layer 112 | 1–2 | 2 | $1E16 < N_d < 2E17$ |
| P+ source layer 114 | 0.2–0.7 | 2 | $N_a > 5E17$ |
| Shallow N+ region (switch-turn-off region) 124 | 0.1–0.5 | 2 | $N_d > 5E17$ |
| N collector layer 118 | 1–2 | 2 | $1E16 < N_d < 2E17$ |
| N+ ohmic contact layer 120 | 0.5 | 2 | $N_d > 5E17$ |

The body of the switch is formed from a semiconductor such as SiC, Si, or diamond that exhibits adequate usability and breakdown characteristics in high power applications.

The dopant types in the switch 100 described above may be reversed. For example, the N+ substrate layer 102 and P− drift layer 104 may be doped P+ and N−, respectively. In the same implementation, the N base layer 112 and N collector layer 118 would be P doped, and the P+ source layer 114 and N+ ohmic contact layer 120 would be doped N+ and P+, respectively. Also, a switch designed for a higher blocking voltage would have a thicker drift layer 104.

FIG. 2 is a perspective view of the switch as illustrated in FIG. 1. The switch 100, designed for a blocking voltage of 6.5 Kv and a current of 20 mA, has a width W and length L of 8 and 1000 microns, respectively. Many individual switches 100 can be provided side-by-side in a switch device (see FIG. 6) to allow for a desired current rating. FIG. 2 also shows a portion of adjacent gates (128A, 128B) used for adjacent switches. Typical switch devices can have 500–1000 thyristor and transistor pairs. The proportion of thyristor mesas 106 to transistor mesas 110 may be changed from 1:1 to 2:1 or 3:1 to allow for lower conduction loss at the expense of current turn-off capability. Similarly, the proportion may be changed from 1:1 to 1:2 or 1:3 to allow for higher current turn-off capability at the expense of conduction loss. The proportion of thyristor to transistor mesa width may be changed to allow for similar performance modification. For example, increasing the thyristor mesa width in comparison to the transistor mesa width would lower the forward conduction loss of the switch at the expense of current turn-off capability. Decreasing the thyristor mesa width in comparison to the transistor mesa width would allow for higher current turn-off capability at the expense of conduction loss.

FIG. 3 illustrates the current flow during turn-on for the switch of FIG. 1. A negative gate voltage $V_g$ is applied at the gate electrode G, preferably −15 volts, to begin a turn-on of the thyristor. Layers 114/112/104 initially function as a FET with a thin P-type inversion channel 302 created in the base layer 112 approximately 100 Angstroms thick, extending from the source layer 114, along and adjacent to the insulating layer 126, to the drift layer 104. A limited current 304 flows through FET 114/112/104 into the base of NPN bipolar transistors 112/104/102 and 118/104/102, turning them on. This in turn induces a current flow 305 into the non-inverted portion of base layer 112, which provides the base current of upper PNP bipolar transistor 114/112/104, turning it on to provide a regenerative thyristor action to the thyristor mesa 106. The thyristor mesa 106 becomes latched on as more holes and more electrons flood the drift layer 104, resulting in decreased resistance and increased current flow through the switch 100. The entire switch 100 is thus "on" between the anode A and cathode C, with the thyristor 106 and transistor 110 conducting approximately 75% and 25% of the total current flow, respectively, due to the lower resistance of the thyristor. The thyristor remains latched, keeping the transistor conductive, even if the gate voltage is removed. In this on-state, the switch 100 acts as a diode having a low forward voltage drop.

If the switch 100 is manufactured with an opposite doping conductivity to that shown in FIG. 1, a positive gate voltage is applied to turn it on and a negative voltage to turn it off.

FIG. 4 illustrates the turn-off operation for the switch 100. Upon application of a positive voltage at the gate electrode G, typically +15 V for the parameters of Table 1, the P-type inversion channel 302 collapses and a depletion region 402 (reduced hole carriers) forms in the drift layer 104 in the vicinity of gate 129, extending under the thyristor and transistor mesas. The gate voltage also reverse biases the PN junction defined by the shallow N+ switch-turn-off region 124 and the drift layer 104 to extend the depletion region 402 vertically and horizontally further into the drift layer 104. More particularly, the reverse biasing provides a thick depletion region in the drift layer 104 to form a high potential barrier for holes to terminate the regenerative thyristor action to turn off the switch. For example, a 6.5 Kv switch, as described in Table 1 (including the N+ shallow switch turn-off region 124), allows turn-off of approximately 5,000 A at 3000 VAK (Anode-to-Cathode voltage). Without the shallow N+ region 124, the switch's current turn off capability would be less than 100 A at 100 VAK. While the depletion region 402 extends through the drift layer lateral to the gate, in this area the potential barrier is lower than in the vicinity of the p-n junction. Extending the depth of the gate recess D would increase the potential barrier thickness thus enhancing switch's current turn-off capability, but would also result in a slightly higher forward voltage drop.

With the depletion region 402 all the way across the thyristor's portion of the drift layer 104, regenerative thyristor action is terminated very rapidly. A turn-off time of 10 nsec has been simulated. The transistor is then turned off as a result of the recombination of minority carriers. The turn-off time depends on the minority carrier lifetime, which in turn is a function of the dopant concentration, defects and impurities in the drift layer 104. A longer carrier lifetime leads to a slower turn off, while a shorter lifetime leads to a faster turn off. A higher dopant concentration or introduction of more material defects (due to implantation damage) would produce a shorter minority carrier life time, while decreasing the dopant concentration or limiting implantation damage would produce a longer minority carrier life time.

FIG. 5 is a perspective view of one embodiment of the switch illustrated in FIG. 1. An N+ thyristor ohmic contact layer 500 is added to the thyristor mesa 106 in place of a portion of the P+ source layer 114. In a switch having the dimensions listed in Table 1, the ohmic layer 500 has a thickness of 0.5 microns, a width of 2 microns, and a length of 2–10 microns. Its thickness and width are similar to the N+ ohmic contact layer 120 in the transistor mesa 110. Single or multiple additions are used, being spaced along the length L of the switch to shunt current from the remainder of the thyristor mesa 106 during turn-off to enable a rapid termination of the thyristor regenerative action.

Figure 6:
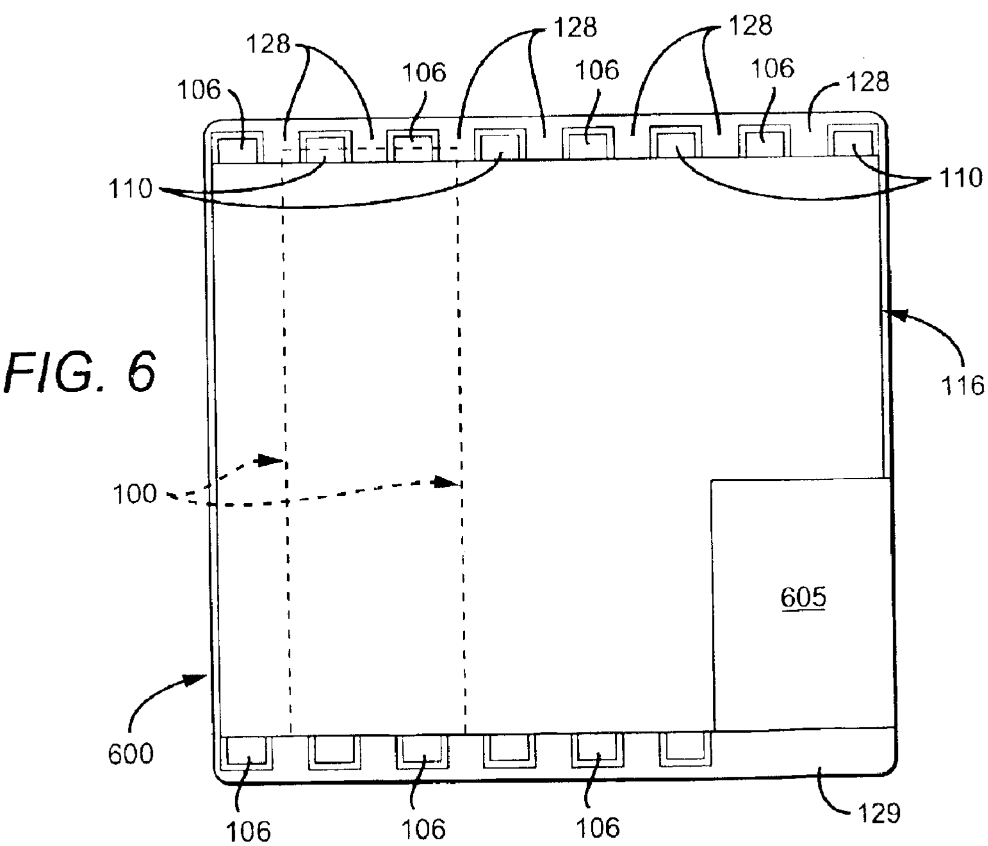
FIG. 6 is a plan view of a high-power switch utilizing a plurality of switches spaced side-to-side in accordance with one embodiment of the invention.

In one implementation of the invention shown in FIG. 6, many individual switches, such as the individual switch 100 illustrated in FIG. 1, are combined to form a single high-power switch 600 having a 1:1 ratio of thyristors and transistors (106, 110) interdigitated with gates 128. The anode metal 116 forms a sheet over the thyristor and transistor mesas (106, 110). A common gate pad 605 is connected to the gates 128 through the conductive material 129. The cathode metal 103 is formed on the opposite side of the switch (not shown) to connect to the common cathode C (not shown). All of the individual switches are thus operated in parallel, providing a proportionately greater current capability than any individual switch. Although the switch 600 is shown with rectangular thyristors and transistors interdigitated with gates, the thyristors, transistors and gates may be interdigitated in other shapes. For example, they may form a circular, square, zig-zag, or spiraling pattern of interdigitated thyristors, transistors and gates.

While various implementations of the application have been described, it will be apparent to those of ordinary skill in the art that many more embodiments and implementations are possible that are within the scope of this invention.

I claim:

1. A semiconductor switch, comprising:

a thyristor including a base region;

a current shunt which shunts current from said thyristor during turn-off to enable a rapid termination of thyristor regenerative action; and a gate disposed adjacent to and insulated from said base region, said thyristor including a drift layer adjacent said base region and extending under said gate, further comprising a heavily doped turn-off region under said gate which establishes a p-n junction with said drift layer so that application of a turn off bias voltage to said gate establishes a depletion region in said drift layer with a potential barrier sufficient to cut off a rated thyristor current level.

2. The semiconductor switch of claim 1, wherein said current shunt includes a drift layer having a light opposite polarity doping to provide a path for said shunted current.

3. The semiconductor switch of claim 1, said current shunt comprising a bipolar transistor whose conductive state is controlled by said thyristor.

4. The semiconductor switch of claim 3, wherein said bipolar transistor is turned off in response to said thyristor turning off.

5. The semiconductor switch of claim 4, said transistor having a longer turn-off time than said thyristor, and providing a transient shunt path for thyristor current when said thyristor turns off.

6. The semiconductor switch of claim 4, wherein said thyristor and transistor are mutually spaced apart but share a common drift layer which extends between them and provides a current path for turning the transistor on and off.

7. A semiconductor switch, comprising:

a drift layer with a light first polarity doping;

a thyristor which includes a first portion of said drift layer;

a transistor which includes a second portion of said drift layer; and an insulated gate disposed between said transistor and thyristor and controlling the operation of said thyristor, said thyristor controlling the operation of said transistor.

8. The semiconductor switch of claim 7, further comprising:

a switch turn-off region disposed below said insulated gate, said region having a heavy opposite polarity doping so that application of an opposite polarity voltage to said gate results in a depletion region extending through said thyristor to turn off the switch.

9. The semiconductor switch of claim 8, wherein said drift layer is on a substrate having a heavy opposite polarity doping, said thyristor further comprising a base layer having said opposite polarity doping on said drift layer, and a source layer having said first polarity on said base layer so that an inversion channel is created in said base layer adjacent to said gate when a turn-on voltage is applied to said gate.

10. A semiconductor switch, comprising:

a substrate region having a heavy doping of a first polarity;

a drift layer on said substrate region having a light doping of an opposite polarity;

a thyristor formed from a first portion of said substrate region and drift layers and further including:

a base layer having a doping of said first polarity on said drift layer first portion;

a source layer having a heavy doping of said opposite polarity on said base layer;

a transistor formed from a second portion of said substrate region and drift layers and further comprising a collector layer having a doping of said first polarity on said drift layer second portion;

a gate sandwiched between said transistor and thyristor and insulated from each by an insulating layer; and a switch-turn-off region having a heavy doping of said first polarity between said insulating layer and said drift layer and disposed substantially under said gate;

wherein a voltage of an opposite polarity applied to said gate causes an inversion channel to form in said base layer and adjacent to said gate to allow current injection from said source layer to said drift layer to turn on said thyristor and transistor.

11. The semiconductor switch according to claim 10, wherein said switch-turn-off region is approximately 0.5 microns thick.

12. The semiconductor switch according to claim 10, wherein said gate extends approximately 2 microns into said drift layer.

* * * * *

UNITED STATES PATENT AND TRADEMARK OFFICE

CERTIFICATE OF CORRECTION

PATENT NO. : 6,965,131 B2
APPLICATION NO. : 10/383598
DATED : November 15, 2005
INVENTOR(S) : Hsueh-Rong Chang It is certified that error appears in the above-identified patent and that said Letters Patent is hereby corrected as shown below:

In column 1, line 5 (following the title and preceding the heading "Background of the Invention"), the following government rights statement should be inserted:

-- This invention was made with Government support under Contract N00014-99-3-0006 awarded by the U.S. Navy, Office of Naval Research. The Government has certain rights in this invention. --

Signed and Sealed this

Thirtieth Day of December, 2008

JON W. DUDAS
*Director of the United States Patent and Trademark Office*